United States Patent
Naya

(10) Patent No.: US 9,887,388 B2
(45) Date of Patent: Feb. 6, 2018

(54) ELECTROLUMINISCENT ELEMENT HAVING A HIGH EFFIENT LIGHT OUTPUT

(75) Inventor: Masayuki Naya, Ashigarakami-gun (JP)

(73) Assignee: UDC Ireland Limited, Dublin (IE)

( * ) Notice: Subject to any disclaimer, the term of this patent is extended or adjusted under 35 U.S.C. 154(b) by 144 days.

(21) Appl. No.: 13/124,023

(22) PCT Filed: Oct. 15, 2009

(86) PCT No.: PCT/JP2009/068151
§ 371 (c)(1),
(2), (4) Date: Apr. 13, 2011

(87) PCT Pub. No.: WO2010/044489
PCT Pub. Date: Apr. 22, 2010

(65) Prior Publication Data
US 2011/0198654 A1 Aug. 18, 2011

(30) Foreign Application Priority Data
Oct. 17, 2008 (JP) ................................ 2008-269011

(51) Int. Cl.
*H01L 33/00* (2010.01)
*H01L 51/52* (2006.01)

(52) U.S. Cl.
CPC ...... *H01L 51/5268* (2013.01); *H01L 51/5275* (2013.01); *H01L 2933/0091* (2013.01)

(58) Field of Classification Search
CPC ......... H01L 33/22; H01L 33/42; H01L 33/58; H01L 2933/0091; H01L 51/5268; H01L 33/44

(Continued)

(56) References Cited

U.S. PATENT DOCUMENTS 5,298,366 A * 3/1994 Iwasaki ................ G02B 3/0018
264/2.5
6,847,057 B1 * 1/2005 Gardner et al. ................ 257/99
(Continued)

FOREIGN PATENT DOCUMENTS

CN 1665361 A 9/2005
EP 1603367 12/2005
(Continued)

OTHER PUBLICATIONS

Japanese Office Action for Application No. 2008-269011 dated May 29, 2012.
(Continued)

*Primary Examiner* — Jesse Y Miyoshi
(74) *Attorney, Agent, or Firm* — Riverside Law LLP

(57) ABSTRACT

A light emitting element includes an anode, a light transmitting cathode, and a light emitting layer sandwiched therebetween, formed on a surface of a substrate. Light emitted by the light emitting layer by voltage being applied between the electrodes is output from a surface toward the side of the light transmitting electrode. A light scattering layer for scattering evanescent light generated at the surface is provided on the surface of the light transmitting electrode. The light scattering layer has a first scattering portion having an uneven structure and a lower refractive index than the light emitting layer, and second scattering portions that fill at least the bottoms of recesses of the uneven structure and has a different refractive index from the first scattering portion. The distance between the bottoms of the recesses and the surface of the light transmitting electrode is a seepage depth of the evanescent light or less.

8 Claims, 1 Drawing Sheet

(58) Field of Classification Search
USPC .............. 257/79, 98, 100, E33.067, E33.074
See application file for complete search history.

(56) References Cited

U.S. PATENT DOCUMENTS

| | | | |
|---|---|---|---|
| 7,135,709 B1* | 11/2006 | Wirth .................... | H01L 33/025 257/95 |
| 7,759,861 B2 | 7/2010 | Fujimoto et al. | |
| 7,910,941 B2* | 3/2011 | Chen ....................... | H01L 33/44 257/233 |
| 2004/0012980 A1* | 1/2004 | Sugiura ............... | H01L 51/5262 362/560 |
| 2005/0194896 A1 | 9/2005 | Sugita et al. | |
| 2006/0043362 A1 | 3/2006 | Ishikawa et al. | |
| 2006/0125388 A1 | 6/2006 | Song et al. | |
| 2007/0284601 A1* | 12/2007 | Khanarian .............. | H01L 33/22 257/98 |
| 2009/0057700 A1* | 3/2009 | Jin et al. .......................... | 257/98 |
| 2009/0140276 A1 | 6/2009 | Kuratate | |

FOREIGN PATENT DOCUMENTS

| | | |
|---|---|---|
| EP | 1879238 A | 1/2008 |
| JP | 2005251488 A | 9/2005 |
| JP | 2006-85985 A | 3/2006 |
| JP | 2006066263 A | 3/2006 |
| JP | 2006-221976 A | 8/2006 |
| JP | 2006-236748 A | 9/2006 |
| JP | 2008-60092 A | 3/2008 |

OTHER PUBLICATIONS

Extended European Search Report for EP Patent Application No. 09820662.6, dated Feb. 1, 2013, 6 pages.

* cited by examiner

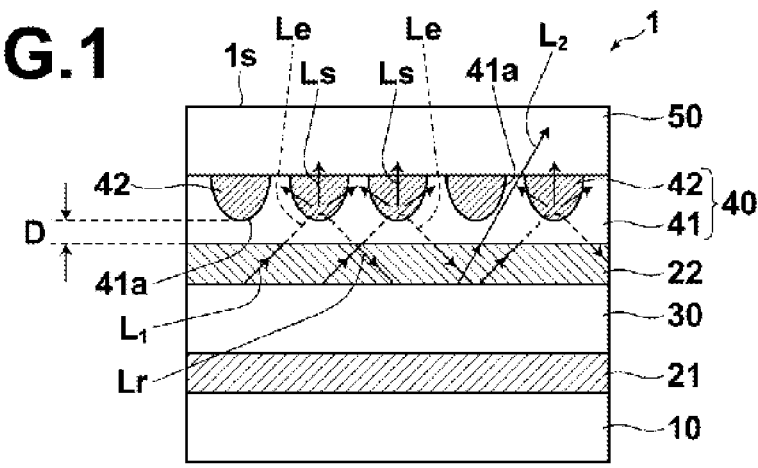
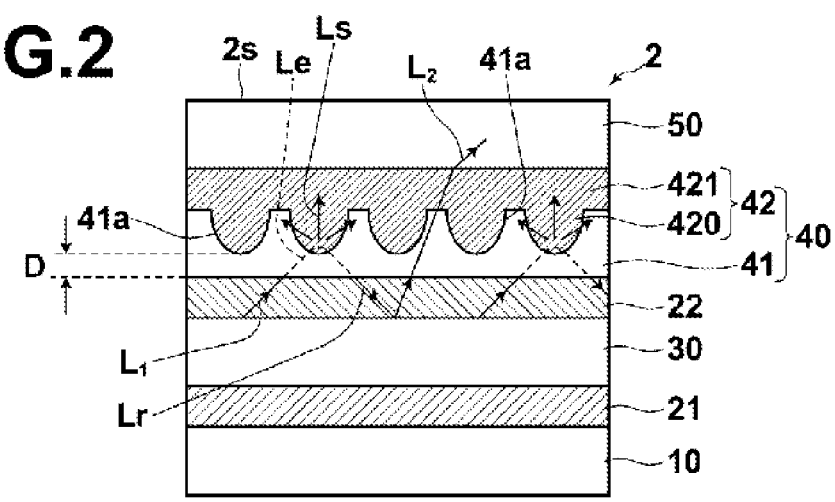
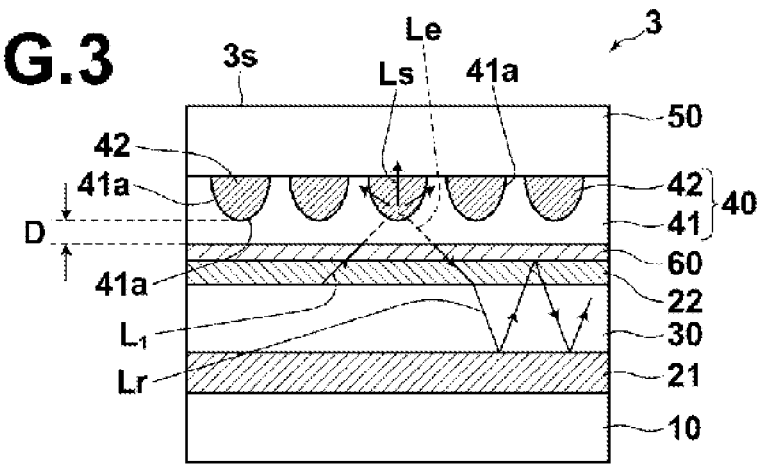

ELECTROLUMINISCENT ELEMENT HAVING A HIGH EFFIENT LIGHT OUTPUT

CROSS REFERENCE TO RELATED APPLICATIONS

This application is a National Stage of International Application No. PCT/JP2009/068151 filed Oct. 15, 2009, claiming priority based on Japanese Patent Application No. 2008-269011 filed Oct. 17, 2008, the contents of all of which are incorporated herein by reference in their entirety.

TECHNICAL FIELD

The present invention is related to electroluminescent elements, such as organic or inorganic EL (electroluminescence) elements and an LED's (Light Emitting Diodes).

BACKGROUND ART

Electroluminescent elements such as organic EL elements and LED's are of a structure in which electrode layers, light emitting layers and the like are laminated on a substrate. Commonly, light emitted within a light emitting layer is output through a transparent electrode. At this time, light which enters an interface between layers at a critical angle or greater is totally internally reflected and trapped within the element, due to the influence of the refractive index of each layer, and is not output. For this reason, it is difficult for emitted light to be output efficiently. In the case of ITO, which is commonly used as a transparent electrode, the refractive index thereof causes output efficiency to be approximately 20%. Accordingly, improvement of the light output efficiency of electroluminescent elements is a major problem to be solved.

Techniques for effectively causing the totally internally reflected light to be output are being considered with respect to this problem. For example, a technique has been proposed in which the light output efficiency is improved by providing a diffraction grating at an interface between layers at which light is totally internally reflected. In this technique, the diffraction grating changes the optical path of light that enters the interface at an angle greater than or equal to a critical angle. Thereby, the incident angle of the light becomes less than or equal to the critical angle, and the light can be output.

Japanese Unexamined Patent Publication Nos. 2006-221976 and 2006-236748 disclose organic electroluminescent devices in which diffraction gratings are provided at interfaces at which total internal reflection occurs. These organic electroluminescent devices achieve improvement of light output efficiency by reducing view angle dependency, which is a problem to be solved by the diffraction gratings with respect to light output, by varying the pitch and pattern of the diffraction gratings.

However, in the organic electroluminescent devices disclosed in Japanese Unexamined Patent Publication Nos. 2006-221976 and 2006-236748 that change the optical paths of totally reflected light with the diffraction grating to output the light, the improvement in brightness is 1.2 to 1.7 times, which is not sufficient. In addition, the diffraction gratings are formed mainly by etching and the like. Therefore, in structures that output light from the side opposite substrates (top emission type), there is a possibility that electrode layers and light emitting layers will become damaged when forming the diffraction gratings.

The present invention has been developed in view of the foregoing circumstances. It is an object of the present invention to provide a light emitting element that outputs emitted light through a transparent electrode having highly efficient light output, which is capable of being produced without damaging electrode layers or a light emitting layer.

DISCLOSURE OF THE INVENTION

A light emitting element of the present invention comprises:
a substrate;
a pair of electrodes formed on a surface of the substrate; and
a light emitting layer sandwiched between the pair of electrodes;
at least one of the pair of electrodes being a light transmitting electrode, light being emitted from the light emitting layer by voltage being applied between the pair of electrodes, and the light being output from a surface of the light emitting element toward the side of the light transmitting electrode; and is characterized by further comprising:
a light scattering layer provided on the surface of the light transmitting electrode, for scattering evanescent light which is generated at the surface;
the light scattering layer having a first scattering portion having an relief structure and a refractive index lower than the refractive index of the light emitting layer, and second scattering portions that fill at least the bottoms of the recessed portions of the relief structure of the first scattering portion and have a refractive index different from the refractive index of the first scattering portion; and
the distance between the bottoms of the recessed portions and the surface of the light transmitting electrode is less than or equal to a penetration depth of the evanescent light.

In the present specification, the term "light transmitting electrode" refers to an electrode that transmits 70% or greater of the wavelength of the light emitted by the light emitting layer.

The term "relief structure" is an relief structure which is of a size capable of scattering or diffracting the evanescent light generated by total internal reflection of the light emitted by the light emitting layer.

The term "refractive index of the light emitting layer" refers to the refractive index of a layer closest to the light scattering layer, in the case that the light emitting layer is constituted by a plurality of layers.

The phrase "less than or equal to a penetration depth of the evanescent light" refers to a distance of 0. That is, the referent of the phrase includes cases in which the recessed portions are apertures.

The second scattering portions may be constituted by filling portions that fill the recessed portions, and a thin film layer which is formed on the filling portions and on protruding portions of the relief structure.

It is preferable for the light emitting element of the present invention to further comprise:
a protective layer provided on the surface of the light scattering layer at the side thereof opposite the side toward the light transmitting electrode.

It is preferable for the refractive index of the first scattering portion and the refractive index of the protective layer to be approximately the same. It is preferable for the second scattering portions to be formed by metal, or a dielectric having a higher refractive index than the refractive index of the first scattering portion.

The light emitting element of the present invention may further comprise:

a semitransparent/semireflective metal film provided between the light transmitting electrode and the light scattering layer.

The light emitting element of the present invention may be applied to cases in which the light emitting layer is an organic electroluminescent element that includes an organic compound layer, and to cases in which the light emitting layer is an inorganic electroluminescent element that includes an inorganic compound layer.

As described above, an object of the present invention is to provide a light emitting element having a high light output efficiency. Here, the term "light output efficiency" refers to the percentage of light which is output from the element with respect to the total intensity of light emitted by the light emitting layer. Light which is capable of being output refers to all light which is emitted within the light emitting element, and includes light emitted by the light emitting layer and light which is generated by the light emitted by the light emitting layer interacting with substances within the element (such as scattered light and diffracted light).

The light emitting element of the present invention is equipped with the light scattering layer provided on the surface of the light transmitting electrode toward the side that light is output through. The light scattering layer scatters evanescent light which is generated on the surface of the light transmitting electrode layer, by utilizing the relief structure within the range of the penetration depth of the evanescent light and the differences in refractive indices. By adopting this structure, the evanescent light of the light which is totally reflected at the surface of the light transmitting electrode and becomes trapped within the element can be efficiently output to the light scattering layer, and output as scattered light. Therefore, the light output efficiency can be effectively improved.

In addition, the light emitting element of the present invention is capable of being produced without directly processing the light transmitting electrode layer. Therefore, the light emitting element can be produced without damaging the electrode layers or the light emitting layer, even in a structure that outputs light from the side opposite the substrate.

BRIEF DESCRIPTION OF THE DRAWINGS

FIG. 1 is a partial schematic sectional view of an organic electroluminescent element according to an embodiment of the present invention.

FIG. 2 is a partial schematic sectional view of an organic electroluminescent element according to an alternate embodiment of the present invention.

FIG. 3 is a partial schematic sectional view of an organic electroluminescent element according to another alternate embodiment of the present invention.

BEST MODE FOR CARRYING OUT THE INVENTION

[Organic EL Element (Light Emitting Element)]

Hereinafter, a light emitting element according to a first embodiment of the present invention will be described in detail with reference to the attached drawings. FIG. 1 is a partial schematic sectional view of an organic electroluminescent element 1 (hereinafter, referred to as "organic EL element") according to the first embodiment of the present invention. Because the light emitting element of the present embodiment is that which scatters evanescent light which leaks at a total internal reflecting interface of light, the evanescent light is emphasized in FIG. 1.

The organic EL element 1 of the present invention is equipped with: a substrate 10; an anode 21; a light emitting layer 30; and a light transmitting cathode 22. The anode 21, the light emitting layer 30, and the light transmitting cathode 22 are formed on the substrate 10 in this order. The organic EL element 1 is a top emission type light emitting element that causes the light emitting layer 30 to emit light when voltage is applied between the electrodes, and outputs the light from a surface is toward the side of the cathode 22. A light scattering layer 40 that scatters evanescent light which is generated on the surface of the light transmitting cathode 22 is provided on the surface of the light transmitting cathode 22.

The light scattering layer 40 is constituted by: a first scattering portion 41 having an relief structure formed by recessed portions 41a which are open toward the surface of the light scattering layer 40; and second scattering portions 42 that fill at least the bottoms of the recessed portions 41a of the relief structure of the first scattering portion 41 and have a refractive index different from that of the first scattering portion 41.

In the organic EL element 1, light ($L_2$ in FIG. 1) that enters the interface between the cathode 22 and the light scattering layer 40 at an incident angle θ less than a critical angle θc can be output by being emitted toward the surface is . However, light $L_1$ that enters the interface at an incident angle θ greater than or equal to the critical angle θc is totally internally reflected at the interface, and becomes trapped within the element as totally reflected light Lr. The light scattering layer 40 outputs evanescent light Le of the light $L_1$, which is emitted by the light emitting layer 30 and enters the interface with the cathode 22 at an angle θ greater than or equal to the critical angle θc, as scattered light Ls or diffracted light Ls, scattered or diffracted by the recessed portions 41a and the second scattering portions 42 that fill at least the bottoms of the recessed portions 41a. Accordingly, the distance D between the bottoms of the recessed portions 41a and the surface of the cathode 22 is less than or equal to a penetration depth d of the evanescent light Le.

In the present embodiment, a portion of the evanescent light Le can be output even if a single recessed portion 41a is provided, and therefore effective improvement in light output efficiency can be obtained. However, it is preferable for a plurality of the recessed portions 41a to be provided. The sizes of the recessed portions 41a and the distances between adjacent recessed portions 41a are particularly limited, as long as they are sizes and distances that enable scattering or diffraction of the evanescent light Le. Relief structures that cause scattering and diffraction differ according to the wavelength λ of the light emitted by the light emitting layer 30. Therefore, the relief structure can be designed appropriately according to the wavelength of the light emitted by the light emitting layer 30.

Diffraction occurs in the case that a plurality of the recessed portions 41a are provided, and the recessed portions 41a are arranged regularly. In order for diffraction to occur, the pitch of the recessed portions 41a must be greater than λ/n1, when n1 is the refractive index of the first scattering portion 41. Diffraction is effective in cases that light of a specific wavelength is to be output. However, in the case that the output efficiency of only light having a specific wavelength is improved in a white light element, view angle dependency occurs in the light emitting element. Accordingly, it is preferable for the arrangement of the recessed portions 41a to be random, except for cases in which light of a specific wavelength is to be output. In the case of a white light source or a broad light source, it is preferable for the distances among adjacent recessed portions 41a to be randomly set within a range from 50 nm to 2000 nm.

The material of the first scattering portion 41 is not particularly limited, as long as it has a lower refractive index than the refractive index of the light emitting layer 30 and is capable of outputting light emitted by the light emitting layer 30 through the upper surface thereof. However, it is preferable for the light transmissivity of the first scattering portion 41 to be high, from the viewpoint of light output efficiency. In addition, it is preferable for the material of the first scattering portion 41 to be a light transmitting resist material, from the viewpoint of facilitating the production process of the recessed portions 41a. The light transmitting resist material is not particularly limited, as long as it has favorable patterning properties, and any known light transmitting resist material may be employed. However, it is preferable for a light transmitting resist material having high heat resistance, such as polyimide, to be employed in the case that a high temperature film forming process is to be executed after forming the first scattering portion 41.

The method by which the recessed portions 41a are formed is not particularly limited. In the case that the material of the first scattering portion 41 is a resist as described above, the recessed portions 41a may be formed easily by a transfer technique such as nano imprinting, or photolithography. Alternatively, in the case that the material of the first scattering portion 41 is an inorganic material such as glass, the recessed portions 41a may be formed by chemical etching using photolithography, physical etching using a laser beam, mechanical processing, and the like.

The organic EL element 1 of the present embodiment is not of a conventional structure, in which the surface of the cathode 22 at which light loss due to total internal reflection occurs is directly processed to cause a portion of the totally internally reflected light Lr to be output. Instead, the organic EL element 1 is of a structure in which the light scattering layer 40 provided on the surface of the cathode 22 causes the evanescent light Le generated on the surface of the cathode 22 to be output. Accordingly, it is not necessary to process the cathode itself, and the light output structure can be formed without damaging the cathode or the light emitting layer beneath the cathode during processing.

The penetration depth d of evanescent light Le is generally expressed by the following Formula (1).

$$d = \lambda/4\pi(n_h^2 \cdot \sin^2\theta - n_1^2)^{0.5} \quad (1)$$

wherein: $\theta > \theta c$; $\theta c = \sin^{-1}(n_l/n_h)$; $n_h$ is the refractive index of a high refractive index layer; $n_1$ is the refractive index of a low refractive index layer; $\theta$ is the incident angle of light that enters the interface between the high refractive index layer and the low refractive index layer; and $\lambda$ is the wavelength of the light.

In the present embodiment, the high refractive index layer is the cathode 22, and the low refractive index layer is the first scattering portion 41. Therefore, the refractive indices of these layers and the wavelength of light which is emitted by the light emitting layer 30 may be inserted into Formula (1). The penetration depth d becomes smaller as the incident angle θ becomes greater. Therefore, it becomes possible to output evanescent light Le of light having a greater range of incident angels as the distance D between the surface of the cathode 22 and the bottoms of the recessed portions 41a becomes shorter. The bottoms of the recessed portions 41a may be in contact with the surface of the cathode 22(D=0). However, there is a possibility that the cathode 22 will become damaged during the manufacturing process of the recessed portions 41a, which will adversely influence the element properties. It is preferable for the distance D to be as small as possible within a range that will not damage the cathode 22 during the manufacturing process.

The second scattering portions 42 may be formed by a dielectric material or a metal material, as long as the refractive index thereof differs from that of the first scattering portion 41.

In the case that the second scattering portions 42 are formed by a dielectric material, it is preferable for the refractive index $n_2$ of the second scattering portions 42 to be higher than the refractive index $n_1$ of the first scattering portion 41. Examples of such materials are those that include silicon oxide.

In the case that the second scattering portions 42 include a metal material, a desired metal material may be utilized. In the case that the second scattering portions 42 are constituted by a plurality of metal pieces which are provided discretely from each other in individual recessed portions 41a as illustrated in FIG. 1, localized plasmon can be induced in the metal pieces by the emitted light, and the electric field enhancing effect of the localized plasmon can amplify the intensity of the output light. Accordingly, it is preferable to employ metal materials, in which localized plasmon is effectively induced with respect to the wavelength of the emitted light, as the material of the second scattering portions 42.

In FIG. 1, the second scattering portions 42 are of a structure in which a plurality of metal pieces which are provided discretely from each other in individual recessed portions 41a. Alternatively, the second scattering portions 42 may be constituted by filling portions 420 that fill the recessed portions 41a, and a thin film layer 421, which is formed on the filling portions 420 and on the surface of the cathode 41 at which the recessed portions 41a are not provided (protruding portions), as in an organic EL element 2 illustrated in FIG. 2. The structure of the organic EL element 2 of FIG. 2 is the same as that of the organic EL element 1 of FIG. 1, except for the second scattering portion 42.

In the organic EL element 2, an advantageous effect that surface plasmon is induced at the surface of the thin film layer 421 by light which enters the thin film layer 421 at a total internal reflection angle to generate an enhancing electric field may be obtained, in addition to the advantageous effect of the light scattering layer 40 improving the light output efficiency described with reference to the organic EL element 1. In this case, the enhancing electric field can amplify the intensity of light output through layers above the surface of the thin film layer 421. Therefore, the intensity of the light which is output can be increased further.

In addition, the thin film layer 421 is illustrated as a layer having a smooth surface in FIG. 2. Alternatively, the thin film layer 421 may have recesses and protrusions corresponding to the recesses and protrusions of the first scattering portion. In this case, the relief structure on the surface of the thin film layer 421 will scatter light further, and even higher intensity light can be output.

The organic EL element 1 (light emitting element) is provided with the light scattering layer 40 on the surface of the cathode 22 toward the surface 1s (2s) through which light is output. The light scattering layer 40 scatters the evanescent light Le which is generated at this surface, utilizing the relief structure and the refractive index difference which are present within the range of penetration depth d of the evanescent light Le. By adopting this structure, the evanescent light Le of the light which is totally reflected at the surface of the cathode 22 and becomes trapped within the element from the light emitted by the light emitting layer 30 can be efficiently output to the light scattering layer 40, and output as scattered light Ls. Therefore, the light output efficiency can be effectively improved.

In addition, the organic EL element 1 is capable of being produced without directly processing the cathode 22. Therefore, the organic EL element 1can be produced without damaging the cathode 22 or the light emitting layer 30, even in a structure that outputs light from the side opposite the substrate 10.

In an organic EL element 3 illustrated in FIG. 3, a semitransparent/semireflective metal film 60 is provided between the cathode 22 and the light scattering layer 40.In this structure, light which is reflected by the metal film 60 is multiply reflected between the metal film 60 and the anode 21. The multiply reflected light resonates at a specific wavelength.

In this structure, the resonance amplifies the electric field on the metal film 60. The enhanced electric field amplifies the intensity of both the scattered light Ls generated in the light scattering layer 40 and the transmitted light $L_2$, and an even higher intensity of light can be output.

A desired metal may be employed as the material of the semitransparent/semireflective metal film 60. The metal film 60 may be a solid film, but it is preferable that the light transmissivity of the film is high, because it is desirable for the absolute amount of output light to not decrease. Accordingly, it is preferable for the metal 60 to be that which has gaps formed therein by patterning or the like. It is preferable for the metal film 60 to be formed by the oblique vapor deposition method or the like.

In the case that the metal film 60 is a solid film of a thickness capable of inducing surface plasmon, or is a film with gaps formed such that the metal portions of the metal film 60 are capable of inducing localized plasmon, the electric field on the metal film 60 is enhanced by the plasmon, as described above. In the organic EL element 3, the amplification effect of the resonance and the electric field enhancing effect of the plasmon can effectively amplify the intensity of the output light.

Hereinafter, the layers that constitute the organic EL elements 1 through 3 other than the light scattering layer 40 and the metal film 60 will be described.

(Substrate)

The material of the substrate 10 is not particularly limited, but optical glass and the like are preferred. The embodiments described above are light emitting elements of the top emission type that output light from the surface is opposite the substrate 10. However, in the case that the light emitting element is of the bottom emission type that outputs light from the side of the substrate 10, or a double sided emission type that outputs light from both sides of the light emitting element, it is preferable for the substrate to be a formed by a light transmitting material that does not scatter or attenuate the light emitted by the light emitting layer 30. Specific examples of such materials include: inorganic materials such as yttria stabilized zirconia (YSZ) and glass; polyesters such as polyethylene terephthalate, polybutylene terephthalate, and polyethylene naphthalate; and organic materials such as polystyrene, polycarbonate, polyether sulfone, polyacrylate, polyimide, polycycloolefin, norbornene resin, and poly (chloro trifluoroethylene). It is preferable for the material of the substrate to be that which has superior light transmitting properties with respect to the emitted light.

For example, in the case that glass is used as the material of the substrate, it is preferable for non alkali glass to be employed, in order to reduce the amount of eluted ions from the glass. In the case that soda lime glass is used as the material of the substrate, it is preferable for that on which a barrier coating formed by silica is administered to be utilized. In the case that an organic material is employed as the material of the substrate, it is preferable for an organic material which is superior in heat resistance, dimensional stability, solvent resistance, electrical insulation properties, and workability.

The shape, structure and size of the substrate 10 are not particularly limited, and may be selected as appropriate according to the intended use, objective and the like of the light emitting element. Commonly, it is preferable for the substrate 10 to be of a planar shape. The substrate 10 may be of a single layer structure, or a multilayer structure. In addition, the substrate 10 may be formed by a single member, or two or more members.

A moisture permeation preventing layer (gas barrier layer) may be provided on the top surface or the bottom surface of the substrate 10. Inorganic materials such as silicon nitride and silicon oxide can be favorably employed as the material of the moisture permeation preventing layer (gas barrier layer). The moisture permeation preventing layer (gas barrier layer) may be formed by the high frequency sputtering method, for example. In the case that a thermoplastic substrate is employed, functional layers such as a hard coating layer and an undercoating layer may be provided as necessary.

(Anode)

The anode 21 may be of any shape, structure, or size as long as it functions as an electrode that supplies positive holes to the light emitting layer 30, and may be selected as appropriate according to the intended use, objective and the like of the light emitting element.

It is preferable for the material of the anode to be a metal, an alloy, a metal oxide, a conductive compound, or a mixture of the above having high work functions. Specific examples of such materials include: tin oxides doped with antimony or fluoride (ATO, FTO) ; conductive metal oxides such as tin oxide, zinc oxide, indium oxide, indium tin oxide (ITO) , and indium zinc oxide (IZO) ; metals such as gold, silver, chrome, and nickel; mixtures of the above metals and metal oxides; laminates of the above metals and metal oxides; inorganic conductive materials such as copper iodide and copper sulfide; organic conductive materials such as polyaniline, polythiophene, and polypyrrole, and laminates of the above materials and ITO.

The anode 21 may be formed on the substrate 10 by a method selected by taking the compatibility of the material thereof into consideration. Examples of methods for forming the anode 21 include: wet methods such as the printing method and the coating method; physical methods such as the sputtering method and the ion plating method; and chemical methods such as CVD and plasma CVD. For example, in the case that ITO is selected as the material of the anode 21, the anode 21 may be formed by the direct current sputtering method, the high frequency sputtering method, the vacuum vapor deposition method, the ion plating method, or the like.

The position at which the anode is formed in the organic EL elements 1 through 3 is not particularly limited, and may be selected as appropriate according to the intended use, objective and the like of the light emitting element. However, it is preferable for the anode to be formed on the substrate 10. In the case that the anode 21 is formed on the substrate 10, the anode 21 may be formed on the entirety of a surface of the substrate 10, or formed in a predetermined pattern on the surface of the substrate 10.

Note that patterning of the anode 21 when it is formed may be performed by chemical etching using photolithography, physical etching using a laser beam, vapor deposition using a mask, sputtering using a mask, the lift off method, or the printing method.

The thickness of the anode 21 may be selected as appropriate according to the material thereof, and cannot be defined uniformly. However, generally, the thickness of the anode 21 is within a range from 10 nm to 50 μm, and preferably within a range from 50 nm to 20 μm.

It is preferable for the resistance value of the anode 21 to be $10^3 \Omega/sq$ or less, and more preferably, $10^2 \Omega/sq$ or less.

In the embodiments described above, in the case that the substrate 10 and the anode 21 are both formed by light transmitting materials, it is preferable for a reflective film, such as a metal film, to be provided between the substrate 10 and the anode 21, in order to enable efficient output of light from the upper surface of the light emitting element.

(Cathode)

The organic EL elements 1 through 3 of the embodiments of the present invention are of the top emission type. Therefore, the cathode 22 needs to be light transmissive, and to function as an electrode that injects electrons into an organic compound layer. The shape, structure, and size of the cathode 22 are not particularly limited, and the material of the cathode 22 may be selected as appropriate form among known electrode materials, according to the intended use, objective and the like of the light emitting element.

It is preferable for the material of the anode to be a metal, an alloy, a metal oxide, a conductive compound, or a mixture of the above having low work functions. Specific examples of such materials include: alkali metals (Li, Na, K, and Cs, for example); alkali earth metals (Mg and Ca, for example); gold; silver; lead; aluminum; sodium-potassium alloys; lithium-aluminum alloys; magnesium-silver alloys; indium; and rare earth metals such as ytterbium. These materials may be used singly, or two or more of the above materials may be favorably combined from the viewpoint of achieving both stability and electron injecting properties.

Alkali metals and alkali earth metals are favorable from the viewpoint of electron injecting properties, while materials having aluminum as the main component thereof are preferable in that they are superior in preservation stability. Materials having aluminum as the main component thereof include: aluminum; an alloy of aluminum with 0.01% to 10% by mass of an alkali metal or an alkali earth metal; and mixtures thereof (a lithium-aluminum alloy and a magnesium-aluminum alloy, for example). Note that the cathode 22 may employ the materials described in Japanese Unexamined Patent Publication Nos. 2(1990)-015595 and 5(1993)-121172.

However, in the case that the aforementioned materials having low work functions are employed, it is necessary for the cathode 22 to be a thin film having a thickness within a range of 0.1 nm to 10 nm, and preferably 5 nm or less, for the cathode 22 to function as a light transmitting electrode. Light transmitting materials such as ITO and IZO are preferable from the viewpoint of light transmissive properties. However, these materials have high work functions, and are suited for use as materials of anodes. Accordingly, it is preferable for the cathode 22 to be of a laminated structure, in which a layer that includes a material having a low work function and a layer of a light transmitting electrode material are laminated, in the top emission type light emitting elements of the embodiments of the present invention. Note that the order in which the layer that includes the material having the low work function and the layer of the light transmitting electrode material are laminated may be set as desired.

The method for forming the cathode 22 is not particularly limited, and the cathode 22 may be formed by a known method, selected by taking the compatibility of the material thereof into consideration. Examples of methods for forming the cathode 22 include: wet methods such as the printing method and the coating method; physical methods such as the sputtering method and the ion plating method; and chemical methods such as CVD and plasma CVD. For example, in the case that metals are selected as the material of the cathode 22, the cathode 22 may be formed by simultaneously or sequentially sputtering the one or two or more metals.

The position at which the anode is formed in the organic EL elements 1 through 3 is not particularly limited. The cathode 22 may be formed on the entirety of a surface of the light emitting layer 30, or formed in a predetermined pattern on the surface of the light emitting layer 30.

Note that patterning of the cathode 22 when it is formed may be performed by chemical etching using photolithography, physical etching using a laser beam, vapor deposition using a mask, sputtering using a mask, the lift off method, or the printing method.

The thickness of the cathode 22 may be selected as appropriate according to the material thereof, and cannot be defined uniformly. However, generally, the thickness of the cathode 22 is within a range from 10 nm to 5 μm, and preferably within a range from 50 nm to 1 μm.

(Light Emitting Layer)

The light emitting layer is a layer in which light is emitted by positive holes and electrons that flow thereinto recombine with light emitting molecules therein, when voltage is applied between the anode 21 and the cathode 22. The light emitting layer 30 may be of any structure as long as a plurality of organic compound layers are laminated and the light emitting layer 30 functions as the light emitting layer of the organic EL elements. The layer structure of the light emitting layer 30 is not particularly limited. An example of a laminated structure is that in which a positive hole transport layer, an organic light emitting layer, and an electron transport layer are laminated in this order from the side of the anode.

A positive hole injecting layer may be provided between the positive hole transport layer and the anode. In addition, an electron transport intermediate layer may be provided between the organic light emitting layer and the electron transport layer. Further, a positive hole transport intermediate layer maybe provided between the organic light emitting layer and the positive hole transport layer. Similarly, an electron injecting layer may be provided between the cathode and the electron transport layer. Note that each of the layers may be divided into a plurality of secondary layers.

Each of the layers that constitute the light emitting layer 30 may be formed by physical methods such as the vapor deposition method, the sputtering method, and the ion plating method, or by wet methods, such as the transfer method, the ink jet method, the spray method, the printing method, and the coating method.

<Organic Light Emitting Layer>

The organic light emitting layer is a layer that functions to receive positive holes from the anode, the positive hole injecting layer, or the positive hole transport layer, to receive electrons from the cathode, the electron injecting layer, or the electron transport layer, and to provide a place where the positive holes and electrons recombine, to emit light.

The organic light emitting layer may be constituted by a single layer or two or more layers. In the case that the organic light emitting layer is constituted by a plurality of layers, each of the plurality of layers may emit light of a different color.

In the embodiments described above, the organic light emitting layer may be constituted only by light emitting material, or may be a mixed layer constituted by a host material and light emitting dopants. The light emitting dopants may be fluorescence emitting materials or phosphorescence emitting materials, and may include more than one type of material. It is preferable for the host material to be a charge transport material. A single type of host material may be employed, or two or more types of host materials maybe employed. For example, an electron transporting host material and a positive hole transporting host material maybe mixed. Further, the organic light emitting layer may include materials that do not have electric charge transport properties or emit light.

The organic light emitting layers of the embodiments of the present invention may contain two or more types of light emitting dopants, in order to improve color purity or to expand the light emitting wavelength range. It is preferable for the light emitting dopants to have an ionization potential difference ($\Delta$Ip) and an electron affinity difference ($\Delta$Ea) with the host material that satisfy the inequalities 1.2 eV>$\Delta$Ip>0.2 eV and/or 1.2 eV>$\Delta$Ea>0.2 eV.

Either phosphorescence emitting materials or fluorescence emitting materials may be employed as the light emitting dopants.

Commonly, complexes that include transition metal atoms or lanthanoid atoms are employed as phosphorescence emitting dopants.

The transition metal atoms are not particularly limited, and examples include: ruthenium; rhodium; palladium; tungsten; rhenium; osmium; iridium; gold, silver, copper, and platinum. Preferably, the transition metal atoms are rhenium, iridium, and platinum, and more preferably, iridium and platinum.

Examples of lanthanoid atoms include: lanthanum; cerium; praseodymium; neodymium; samarium; europium; gadolinium; terbium; dysprosium; holmium; erbium; thulium; ytterbium; and ruthenium. Among these, neodymium, europium, and gadolinium are preferred.

Ligands which are described in G. Wilkinson, "Comprehensive Coordination Chemistry", Pergamon Press, 1987; H. Yersin and A. Volger, "Photochemistry and Photophysics of Coordination Compounds", Springer-Verlag, 1987; and A. Yamamoto, "Organic Metal Chemistry—Basics and Applications", Shokabo, 1982 may be employed as the ligands of the complexes.

Specific examples of the ligands include: halogen ligands (preferably chlorine ligands) ; aromatic carbon ring ligands (for example, cyclopentadienyl anions, benzene anions, or naphthyl anions having a carbon number from 5 to 30, more preferably a carbon number from 6 to 30, even more preferably a carbon number from 6 to 20, and most preferably a carbon number from 6 to 12) ; nitrogen containing hetero ring ligands (for example, phenyl pyridine, benzo quinoline, quinolinol, bipyridyl, or phenanthroline having a carbon number from 5 to 30, more preferably a carbon number from 6 to 30, even more preferably a carbon number from 6 to 20, and most preferably a carbon number from 6 to 12) ; diketone ligands (for example, acetyl acetone); carbonic acid ligands (for example, acetic acid ligands having a carbon number from 2 to 30, more preferably a carbon number from 2 to 20, and even more preferably a carbon number from 2 to 16); alcoholate ligands (for example, phenolate ligands having a carbon number from 1 to 30, more preferably a carbon number from 1 to 20, and even more preferably a carbon number from 6 to 20) ; silyloxy ligands (for example, trimethyl silyloxy ligands, dimethyl-tert-butyl silyloxy ligandsfs, triphenyl silyloxy ligands and the like having a carbon number from 3 to 40, more preferably a carbon number from 3 to 30, and even more preferably a carbon number from 3 to 20); carbon monoxide ligands; isonitryl ligands, cyano ligands, phosphorous ligands (for example, triphenyl phosphine ligands and the like having a carbon number from 3 to 40, more preferably a carbon number from 3 to 30, even more preferably a carbon number from 3 to 20, and most preferably a carbon number from 6 to 20); thiolate ligands (for example, phenyl thiolate ligands and the like having a carbon number from 1 to 30, more preferably a carbon number from 1 to 20, and even more preferably a carbon number from 6 to 20); and phosphine oxide ligands (for example, triphenyl phosphine oxide ligands and the like having a carbon number from 3 to 30, more preferably a carbon number from 8 to 30, and even more preferably a carbon number from 18 to 30) . Among these ligands, nitrogen containing hetero ring ligands are particularly preferable.

The complexes may have a single transition metal atom within their chemical compounds, or may be dinuclear complexes having two or more transition metal atoms. Different types of metal atoms may be included in the complexes.

Specific examples of the light emitting dopants include the phosphorescence emitting compounds disclosed in U.S. Pat. Nos. 6,303,238 and 6,097,147, International Patent Publication Nos. WO 00/57676, WO 00/70655, WO 01/08230, WO 01/39234, WO 01/41512, WO 02/02714, WO 02/15645, WO 02/44189 and WO 05/19373, European Patent No. 1211257, and Japanese Unexamined Patent Publication Nos. 2001-247859, 2002-302671, 2002-117978, 2003-133074, 2002-235076, 2003-123982, 2002-170684, 2002-226495, 2002-234894, 2001-247859, 2001-298470, 2002-173674, 2002-203678, 2002-203679, 2004-357791, 2006-256999, 2007-019462, 2007-084635, and 2007-096259. Among the phosphorescence emitting compounds disclosed in the above patent documents, Ir complexes, Pt complexes, Cu complexes, Re complexes, W complexes, Rh complexes, Ru complexes, Pd complexes, Os complexes, Eu complexes, Tb complexes, Gd complexes, Dy complexes, and Ce complexes are preferable. Ir complexes, Pt complexes, and Re complexes are particularly preferable, and Ir complexes, Pt complexes, and Re complexes that include at least one coordinate modality from among: metal—carbon bonds; metal—nitrogen bonds; metal—oxygen bonds; and metal—sulfur bonds are even more preferable. Further, Ir complexes, Pt complexes, and Re complexes that include multidentate ligands having three or more coordinate bonding sites are particularly preferable, from the viewpoints of light emitting efficiency, drive durability, and color temperature.

Examples of common fluorescent light emitting dopants include: benzoxazole; polybenzimidazole; benzothiazole; styryl benzene; polyphenyl; diphenyl butadiene; tetraphenyl butadiene; naphthalimide; coumalin; pyrane; perinone; oxadiazole; aldazine; pyralidine; cyclopentadiene; bis styryl anthracene; quinacridone; pyrrolo pyridine; thiadiazolo pyridine; cyclopentadiene; styryl amine; aromatic dimethylidyne compounds; condensed polycyclic aromatic compounds (anthracene, phenanthroline, pyrene, perylene, rubrene, pentacene, and the like); various metal complexes represented by 8-quinolinol metal complexes, pyromethane complexes, and rare earth complexes; polymer compounds such as polythiophene, polyphenylene, and polyphenylene vinylene; organic silane; and derivatives thereof.

Specific examples of the light emitting dopants are illustrated below. However, the light emitting dopants are not limited to these compounds.

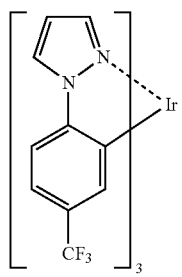
D-1

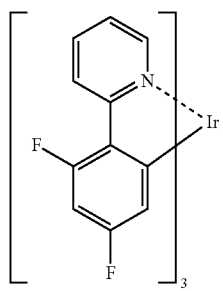
D-2

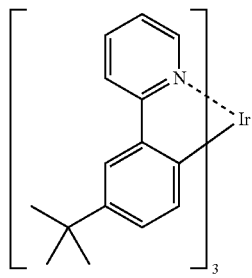
D-3

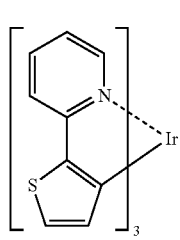
D-4

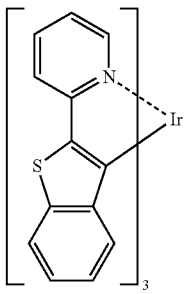
D-5

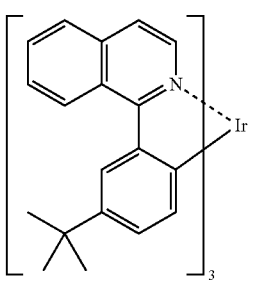
D-6

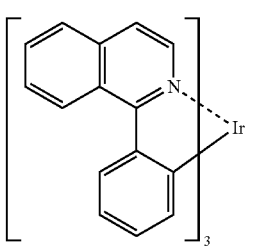
D-7

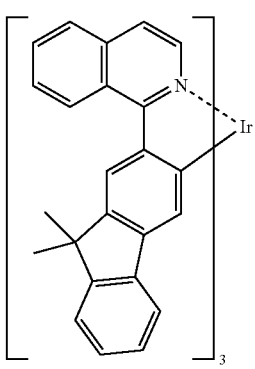
D-8

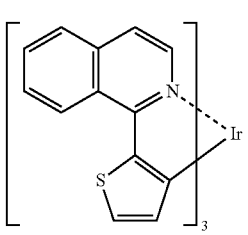
D-9

D-10 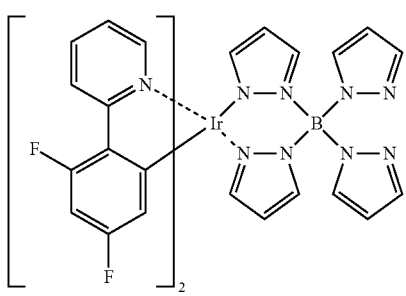
D-11 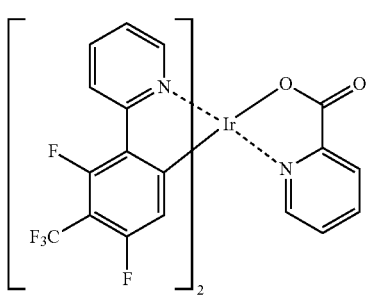
D-12 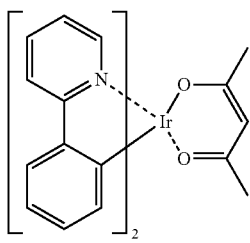
D-13 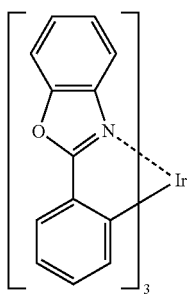
D-14 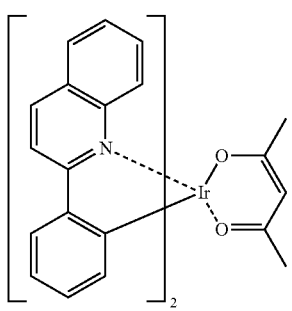
D-15 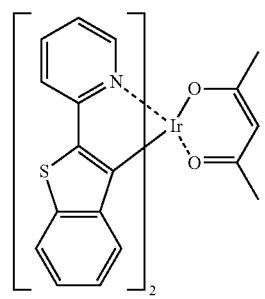
D-16 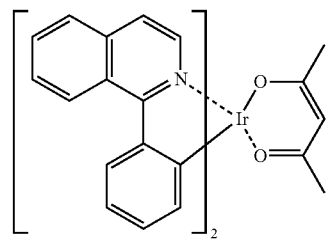
D-17 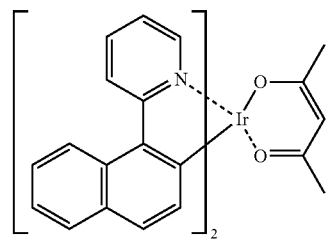
D-18 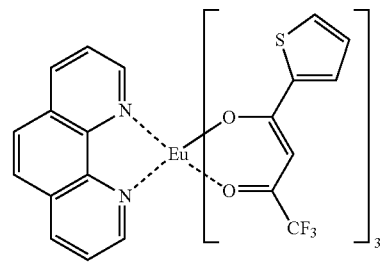
D-19 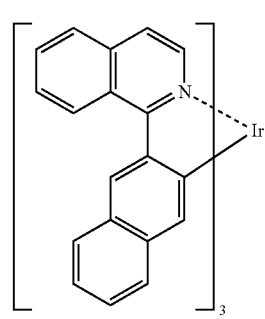
D-20 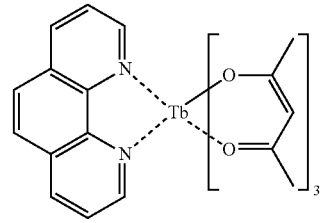

D-21 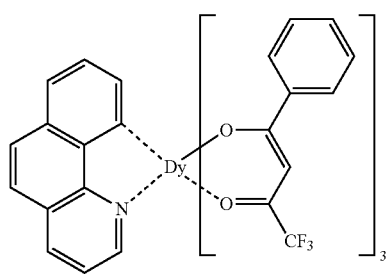
D-22 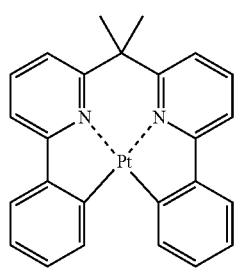
D-23 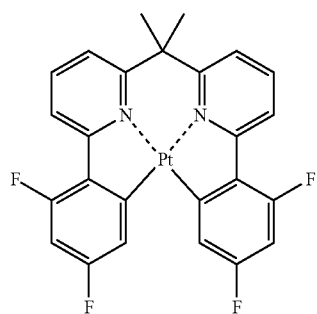
D-24 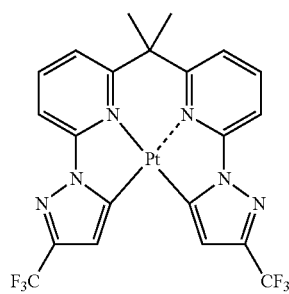
D-25 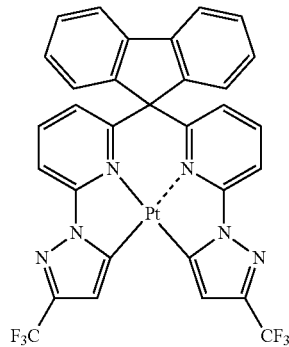
D-26 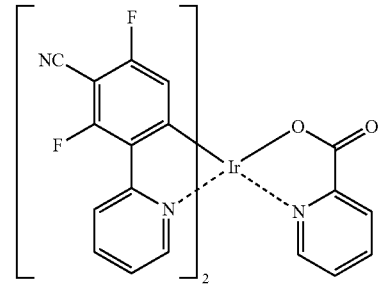
D-27 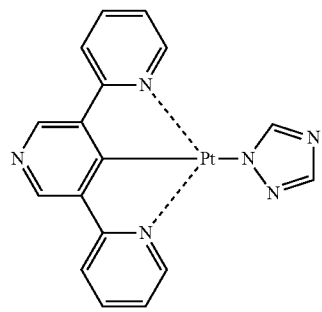
D-28 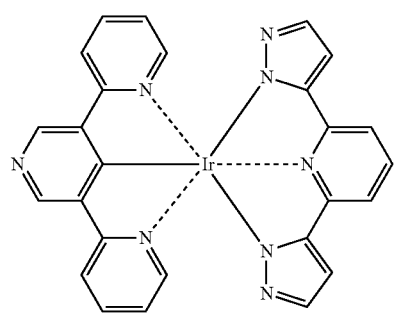
D-29 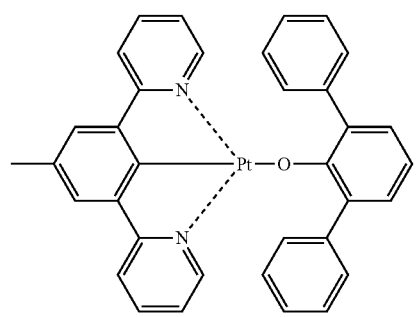
D-30 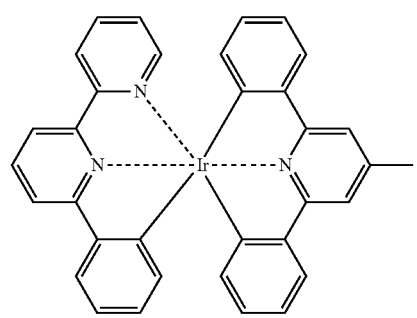

D-31 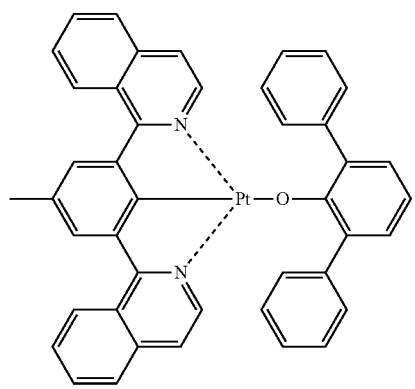
D-32 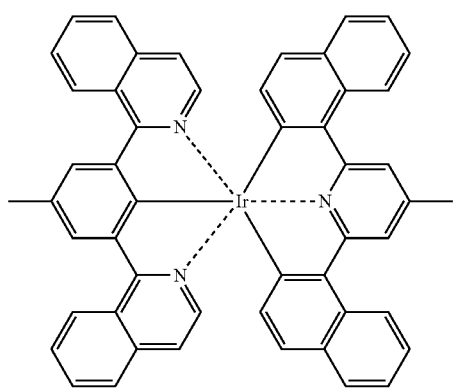
D-33 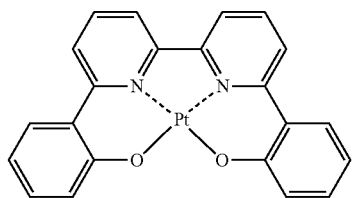
D-34 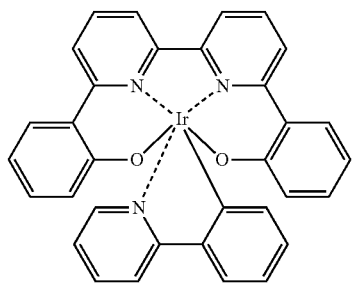
D-35 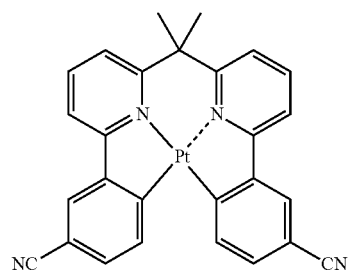
D-36 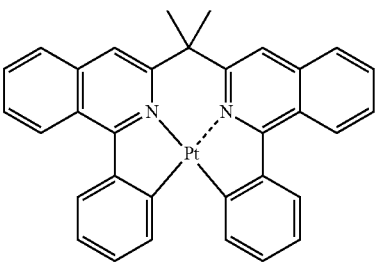
D-37 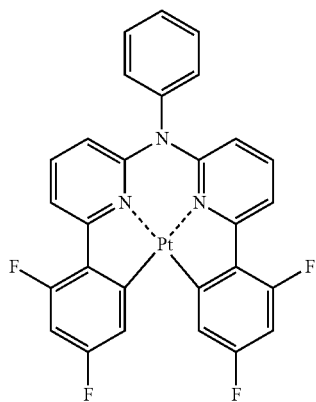
D-38 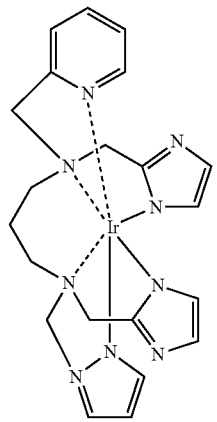
D-39 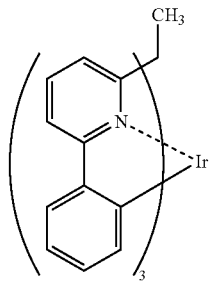

-continued

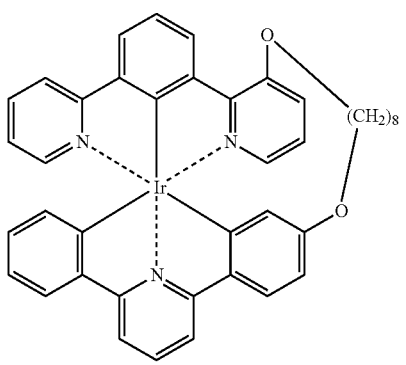
D-40

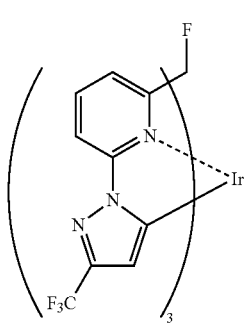
D-41

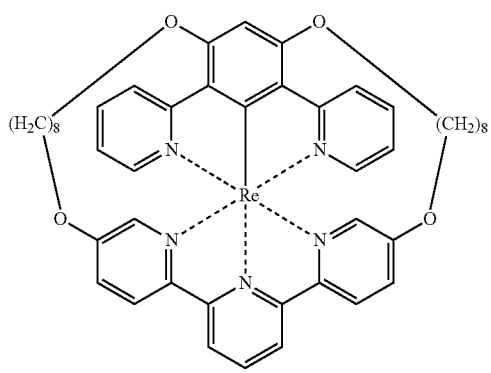
D-42

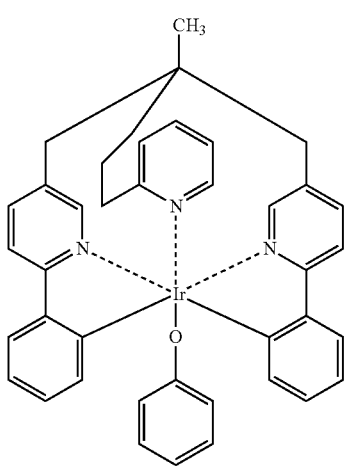
D-43

Among the light emitting compounds illustrated above, D-2, D-3, D-4, D-5, D-6, D-7, D-8, D-9, D-10, D-11, D-12, D-13, D-14, D-15, D-16, D-21, D-22, D-23, D-24, and D-25 are preferable from the viewpoints of light emitting efficiency and durability. Among these, D-2, D-3, D-4, D-5, D-6, D-7, D-8, D-12, D-14, D-15, D-16, D-21, D-22, D-23, and D-24 are more preferable. Further, D-21, D-22, D-23, and D-24 are even more preferable.

Generally, light emitting dopants are included in organic light emitting layers within a range from 0.1% to 50% by mass with respect to the total mass of compounds that form the light emitting layers. It is preferable for the light emitting dopants to be included in the organic light emitting layer within a range from 1% to 50% by mass, and more preferably within a range from 2% to 40% by mass, from the viewpoints of durability and external quantum efficiency.

A positive hole transport host material (hereinafter, also referred to as "positive hole transport host") which is superior in positive hole transporting properties and an electron transport host compound (hereinafter, also referred to as "electron transport host") which is superior in electron transporting properties may be employed as the host material.

Examples of positive hole transport hosts include: pyrrole; indole; carbazole; azaindole; azacarbazole; triazole; oxazole; oxadiazole; pyrazole; imidazole; thiophene; polyallyl alkane; pyrazoline; pyrazolone; phenylene diamine; allyl amine; amino substituted chalcone; styryl anthracene; fluorenone; hydrazone; stilbene; silazane; aromatic tertiary compounds; styryl amine compounds; aromatic dimethylidyne compounds; porphyrin compounds; polysilane compounds; poly (N-vinyl carbazole); anylene copolymers; thiophene oligomers; polythiophene; organic silane; carbon film; and derivatives thereof. Among these, indole derivatives, carbazole derivatives, aromatic tertiary compounds, and thiophene derivatives are preferable. Further, positive hole transport hosts that have carbazole groups in their molecules are more preferable. Positive hole transport hosts that have t-butyl substituted carbazole groups are particularly preferable.

It is preferable for the electron transport host to have an electron affinity Ea within a range from 2.5 eV to 3.5 eV, from the viewpoints of improving durability and decreasing drive current. It is more preferable for the electron affinity Ea of the electron transport host to be within a range from 2.6 eV to 3.4 eV, and even more preferable for the electron affinity Ea to be within a range from 2.8 eV to 3.3 eV. In addition, it is preferable for the ionization potential Ip of the electron transport host to be within a range from 5.7 eV to 7.5 eV, from the viewpoints of improving durability and decreasing drive current. It is more preferable for the ionization potential Ip to be within a range from 5.8 eV to 7.0 eV, and even more preferable for the ionization potential Ip to be within a range from 5.9 eV to 6.5 eV.

Examples of materials of the electron transport host include heterocyclic tetracarbonic acid anhydrides such as: pyridine; pyrimidine; triazine; imidazole; pyrazole; triazole; oxazole; oxadiazole; fluorenone; anthraquino dimethane; anthrone; diphenyl quinone; thiopyran dioxide; carbo diimide; fluorenylidene methane; distyryl pyrazine; fluoride substituted aromatic compounds;

naphthalene perylene; phthalocyanine; and derivatives thereof (that may form condensed rings with other rings), and various metal complexes, such as: metal complexes of 8-quinolinol derivatives; metal phthalocyanine; and metal complexes having benzo oxazole or benzo thiazole as ligands. Among these, metal complexes, azole derivatives (benzimidazole derivatives, imidazopyridine derivatives and the like) azine derivatives (pyridine derivatives, pyrimidine derivatives, triazine derivatives and the like) are preferable. Metal complexes are more preferable from the viewpoint of durability. It is preferable for a metal complex compound (A) to have ligands that have at least one nitrogen atom, at least one oxygen atom, or at least one sulfur atom that coordinately bonds with metal.

The metal ions within the metal complexes are not particularly limited. Preferable examples include: beryllium ions; magnesium ions; aluminum ions; gallium ions; zinc ions; indium ions; tin ions; platinum ions; and palladium ions. Among these, beryllium ions; aluminum ions; gallium ions; zinc ions; platinum ions; and palladium ions are more preferable, and aluminum ions, zinc ions, and palladium ions are most preferable.

Ligands which are described in H. Yersin and A. Volger, "Photochemistry and Photophysics of Coordination Compounds", Springer-Verlag, 1987; and A. Yamamoto, "Organic Metal Chemistry—Basics and Applications", Shokabo, 1982 may be employed as the ligands of the metal complexes.

Specific examples of the ligands include: nitrogen containing hetero ring ligands (preferably having a carbon number from 1 to 30, more preferably a carbon number from 2 to 20, and most preferably a carbon number from 3 to 15; either monodentate ligands or multidentate ligands having two or more and six or less coordinate bonding sites, or a mixture of monodentate ligands and multidentate ligands); azine ligands (for example, pyridine ligands, bipyridyl ligands, and terpyridine ligands); hydroxyphenyl azole ligands (for example, hydroxyphenyl benzimidazole ligands, hydroxyphenyl benzoxazole ligands, hydroxyphenyl imidazole ligands, and hydroxyphenyl imidazopyridine ligands) ; alkoxy ligands (for example, methoxy, ethoxy, butoxy, or 2-ethyl hexyloxy preferably having a carbon number from 1 to 30, more preferably a carbon number from 1 to 20, and most preferably a carbon number from 1 to 10) ; aryloxy ligands (for example, phenyl oxy, 1-naphthyl oxy, 2-naphthyl oxy, 2, 4, 6-trimrthyl phenyl oxy, and 4-biphenyl oxy having a carbon number from 6 to 30, more preferably a carbon number from 6 to 20, and most preferably a carbon number from 6 to 12); heteroaryl oxy ligands (for example, pyridyl oxy; pyradyl oxy; and quinolyl oxy having a carbon number from 1 to 30, more preferably a carbon number from 1 to 20, and most preferably a carbon number from 1 to 12) ; alkylthio ligands (for example, methylthio and ethylthio having a carbon number from 1 to 30, more preferably a carbon number from 1 to 20, and most preferably a carbon number from 1 to 12) ; heteroarylthio ligands (for example, pyridylthio, 2-benzimizorylthio, 2-benzoxazorylthio, and 2-benzthiazorylthio having a carbon number from 1 to 30, more preferably a carbon number from 1 to 20, and most preferably a carbon number from 1 to 12); siloxy ligands (for example, triphenyloxy groups, triethoxy siloxy groups, and triisopropyl siloxy groups having a carbon number from 1 to 30, more preferably a carbon number from 3 to 25, and most preferably a carbon number from 6 to 20); aromatic hydrocarbon anion ligands (for example, phenyl anions, naphthyl anions, and anthranyl anions having a carbon number from 6 to 30, more preferably a carbon number from 6 to 25, and most preferably a carbon number from 6 to 20); aromatic hetero ring anion ligands (for example, pyrrole anions, pyrazole anions, triazole anions, oxazole anions, benzooxazole anions, thiazole anions, benzothiazole anions, thiophene anions, and benzothiophene anions having a carbon number from 1 to 30, more preferably a carbon number from 2 to 25, and most preferably a carbon number from 2 to 20) ; and indolenine anion ligands. Among these ligands, nitrogen containing hetero ring ligands, aryloxy ligands, heteroaryloxy groups, and siloxy ligands are preferable, and nitrogen containing hetero ring ligands, aryloxy ligands, siloxy ligands, aromatic hydrocarbon anion ligands, and aromatic hetero ring anion ligands are most preferable.

The compounds described in Japanese Unexamined Patent Publication Nos. 2002-235076, 2004-214179, 2004-221062, 2004-221065, 2004-221068,and 2004-327313 may be employed as the metal complex electron transport host.

In the organic light emitting layer, it is preferable for the triplet minimum excitation level (T1) of the host material to be higher than that of the phosphorescence emitting material, from the viewpoints of color purity, light emitting efficiency, and drive durability.

In addition, the amount of the host compound within the organic light emitting layer is not particularly limited. However, it is preferable for the host material to be included in the organic light emitting layer within a range from 15% to 95% by mass, with respect to the total mass of the compounds that constitute the organic light emitting layer, from the viewpoints of light emitting efficiency and drive current.

The thickness of the organic light emitting layer is not particularly limited. Preferably, the thickness of the organic light emitting layer is within a range from 2 nm to 500 nm. Within this range, it is more preferable for the thickness of the organic light emitting layer to be within a range from 3 nm to 200 nm, and most preferable for the thickness to be within a range from 5 nm to 100 nm, from the viewpoint of external quantum efficiency.

<Positive Hole Injecting Layer, Positive Hole Transport Layer>

The positive hole injecting layer and the positive hole transport layer receive positive holes from the anode or from the side of the light emitting element toward the anode, and transport the positive holes toward the cathode. The positive hole injecting material and the positive hole transport material may be either a low molecular compound or a high molecular compound.

Specifically, it is preferable for the positive hole injecting layer and the positive hole transport layer to be layers that include: pyrrole derivatives; carbazole derivatives; triazole derivatives; oxazole derivatives; oxadiazole derivatives; imidazole derivatives; polyallyl alkane derivatives; pyrazolene derivatives; pyrazolone derivatives; phenylene diamine derivatives; arylamine derivatives; amino substituted chalcone derivatives; styryl anthracene derivatives; fluorenone derivatives; hydrazone derivatives; stilbene derivatives; sylazane derivatives; aromatic tertiary amine compounds; styryl amine compounds; aromatic dimethyldyne compounds; phthalocyanine compounds; porphyrin compounds; thiophene derivatives; organic silane derivatives; carbon; and the like.

Electron receiving dopants may be contained in the positive hole injecting layer or the positive hole transport layer of the organic EL elements 1 through 3. The electron receiving dopants to be contained in the positive hole injecting layer or the positive hole transport layer may be inorganic compounds or organic compounds, as long as they have electron receiving properties and oxidize organic compounds.

Examples of inorganic compounds for use as the electron receiving dopants include halogenated metals such as: ferric chloride; aluminum chloride; gallium chloride; indium chloride; and antimony pentachloride, and metal oxides such as panadium pentaoxide and molybdenum trioxide.

In the case that organic compounds are used as the electron receiving dopants, compounds having nitro groups, halogen, cyano groups, trifluoromethyl groups and the like, quinone compounds, acid anhydride compounds, and fullerenes may be favorably employed.

In addition, the compounds described in Japanese Unexamined Patent Publication Nos. 6(1994)-212153, 11(1999)-111463, 11(1999)-251067, 2000-196140, 2000-286054, 2000-315580, 2001-102175, 2001-160493, 2002-252085, 2002-056985, 2003-157981, 2003-217862, 2003-229278, 2004-342614, 2005-072012, 2005-166637, and 2005-209643 may be employed as the electron receiving dopants.

Among these compounds, hexacyano butadiene; hexacyano benzene; tetracyano ethylene; tetracyanoquino dimethane; tetrafluorotetracyanoquino dimethane; p-fluoranyl; p-chloranyl; p-bromanyl; p-benzoquinone; 2,6-dichlorobenzoquinone; 2,5-dichlorobenzoquinone; 1,2,4,5-tetracyano benzene; 1,4-dicyanotetrafluoro benzene; 2,3-dichloro - 5,6-dicyanobenzoquinone; p-dinitro benzene; m-dinitro benzene; o-dinitro benzene; 1,4-naphthoquinone; 2,3-dichloro naphthoquinone; 1,3-dinitro naphthalene; 1,5-dinitro naphthalene; 9,10-anthraquinone; 1,3,6,8-tetranitro carbazole; 2,4,7-trinitro-9-fluorenone; 2,3,5,6-tetracyano pyridine; and fullerene C60are preferred. Hexacyano butadiene; hexacyano benzene; tetracyano ethylene; tetracyanoquino dimethane; tetrafluorotetracyanoquino dimethane; p-fluoranyl; p-ohloranyl; p-bromanyl; 2,6- dichlorobenzoquinone; 2,5-dichlorobenzoquinone; 2,3-dichloro naphthoquinone; 1,2,4,5-tetracyano benzene; 2,3-dichloro - 5,6-dicyanobenzoquinone, and 2,3,5,6-tetracyano pyridine are more preferable, and tetrafluoro tetracyano quino dimethane is most preferred.

A single type of electron receiving dopant may be employed, or two or more types of electron receiving dopants may be employed. The amount of electron receiving dopants to be contained differs according to the type of material which is employed. However, it is preferable for the amount of electron receiving dopants to be within a range from 0.01% to 50% by mass, more preferable for the amount to be within a range from 0.05% to 20% by mass, and most preferable for the amount to be within a range from 0.1% to 10% by mass with respect to the positive hole transport layer material.

It is preferable for the thickness of each of the positive hole injecting layer and the positive hole transport layer to be less than or equal to 500 nm, from the viewpoint of decreasing drive current.

It is preferable for the thickness of the positive hole transport layer to be within a range from 1 nm to 500 nm. It is more preferable for the thickness of the positive hole transport layer to be within a range from 5 nm to 200 nm, and most preferable for the thickness of the positive hole transport layer to be within a range from 10 nm to 100 nm. It is preferable for the thickness of the positive hole injecting layer to be within a range from 0.1 nm to 200 nm. It is more preferable for the thickness of the positive hole injecting layer to be within a range from 0.5 nm to 100 nm, and most preferable for the thickness of the positive hole injecting layer to be within a range from 1 nm to 100 nm.

The positive hole injecting layer and the positive hole transport layer may be of single layer structures formed by one or two or more types of the aforementioned materials. Alternatively, the positive hole injecting layer and the positive hole transport layer may be of multilayer structures formed by a plurality of layers of the same or different compositions.

<Electron Injecting Layer, Electron Transport Layer>

The electron injecting layer and the electron transport layer receive electrons from the cathode or from the side of the light emitting element toward the cathode, and transport the electrons toward the anode. The electron injecting material and the electron transport material may be either a low molecular compound or a high molecular compound.

Specifically, it is preferable for the electron injecting layer and the electron transport layer to be layers that include aromativ ting tetracarbon acid anhydrides, such as: pyridine derivatives; quinoline derivatives; pyrimidine derivatives; pyrazine derivatives; phthalazine derivatives; phenanthroline derivatives; triazine derivatives, triazole derivatives; oxazole derivatives; oxadiazole derivatives; imidazole derivatives; fluorenone derivatives; anthraquino dimethane derivatives; anthrone derivatives; diphenyl quinone derivatives; thiopyran dioxide derivatives; carbodiimide derivatives; fluorenylydene methane derivatives; distyryl pyrazine derivatives; naphthalene; and perylene, various metal complexes, such as: metal complexes of 8-quinolinol derivatives and phthalocyanine derivatives; metal phthalocyanine; and metal complexes having benzo oxazole or benzo thiazole as ligands, organic silane derivatives such as silole, and the like.

Electron donating dopants may be contained in the electron injecting layer or the electron transport layer of the organic EL elements 1 through 3. The electron donating dopants to be contained in the electron injecting layer or the electron transport layer must have electron donating properties and reduce organic compounds. Examples of such materials include: alkali metals such as Li; alkali earth metals such as Mg; transition metals containing rare earth metals; and reducing organic compounds. Metals having work functions of 4.2 eV or less can be particularly favorably utilized. Specific examples of such metals include Li, Na, K, Be, Mg, Ca, Sr, Ba, Y, Cs, La, Sm, Gd, and Yb. Examples of the reducing organic compounds include: nitrogen containing compounds, sulfur containing compounds, and phosphor containing compounds.

In addition, the compounds described in Japanese Unexamined Patent Publication Nos. 6(1994)-212153, 2000-196140, 2003-068468, 2003-229278, and 2004-342614 maybe employed as the electron donating dopants.

A single type of electron donating dopant may be employed, or two or more types of electron donating dopants may be employed. The amount of electron donating dopants to be contained differs according to the type of material which is employed. However, it is preferable for the amount of electron donating dopants to be within a range from 0.1% to 99% by mass, more preferable for the amount to be within a range from 1.0% to 80% by mass, and most preferable for the amount to be within a range from 2.0% to 70% by mass with respect to the electron transport layer material.

It is preferable for the thickness of each of the electron injecting layer and the electron transport layer to be less than or equal to 500 nm, from the viewpoint of decreasing drive current.

It is preferable for the thickness of the electron transport layer to be within a range from 1 nm to 500 nm. It is more preferable for the thickness of the electron transport layer to be within a range from 5 nm to 200 nm, and most preferable for the thickness of the electron transport layer to be within a range from 10 nm to 100 nm. It is preferable for the thickness of the electron injecting layer to be within a range from 0.1 nm to 200 nm. It is more preferable for the thickness of the electron injecting layer to be within a range from 0.5 nm to 100 nm, and most preferable for the thickness of the electron injecting layer to be within a range from 1 nm to 100 nm.

The electron injecting layer and the electron transport layer may be of single layer structures formed by one or two or more types of the aforementioned materials. Alternatively, the electron injecting layer and the electron transport layer may be of multilayer structures formed by a plurality of layers of the same or different compositions.

<Positive Hole Blocking Layer>

A positive hole blocking layer is a layer that functions to prevent positive holes, which have been transported from the side of the anode to the organic light emitting layer, from passing through toward the side of the cathode. The positive hole blocking layer may be formed adjacent to the organic light emitting layer toward the side of the cathode 22.

Examples of compounds that constitute the positive hole blocking layer include: aluminum complexes such as BAlq; triazole derivatives; and phenanthrolene derivatives such as BCP.

It is preferable for the thickness of the positive hole blocking layer to be within a range from 1 nm to 500 nm. It is more preferable for the thickness of the positive hole blocking layer to be within a range from 5 nm to 200 nm, and most preferable for the thickness of the positive hole blocking layer to be within a range from 10 nm to 100 nm.

The positive hole blocking layer may be of a single layer structure formed by one or two or more types of the aforementioned materials. Alternatively, the positive hole blocking layer may be of a multilayer structure formed by a plurality of layers of the same or different compositions.

<Electron Blocking Layer>

An electron blocking layer is a layer that functions to prevent electrons, which have been transported from the side of the cathode 22 to the organic light emitting layer, from passing through toward the side of the anode 21. The electron blocking layer may be formed adjacent to the organic light emitting layer toward the side of the anode 21.

The compounds listed above as materials that constitute the positive hole blocking layer may be applied to the electron blocking layer.

It is preferable for the thickness of the electron blocking layer to be within a range from 1 nm to 500 nm. It is more preferable for the thickness of the electron blocking layer to be within a range from 5 nm to 200 nm, and most preferable for the thickness of the electron blocking layer to be within a range from 10 nm to 100 nm.

The electron blocking layer may be of a single layer structure formed by one or two or more types of the aforementioned materials. Alternatively, the electron blocking layer may be of a multilayer structure formed by a plurality of layers of the same or different compositions.

<Protective Layer>

Protective layers 50 are provided on the light scattering layers 40 of the organic EL elements 1 through 3. The protective layers 50 prevent matter that deteriorates the elements, such as moisture and oxygen, from entering the interiors of the elements. It is preferable for the protective layers 50 to contain substances that suppress entry of the matter that deteriorates the elements, such as moisture and oxygen, into the elements. Such substances include: metals, such as In, Sn, Pb, Au, Cu, Ag, Al, Ti, and Ni; metal oxides, such as MgO, SiO, $SiO_2$, $Al_2O_3$, GeO, NiO, CaO, BaO, $Fe_2O_3$, $Y_2O_3$, and $TiO_2$; metal nitrides, such as $SiN_x$ and $SiN_xO_y$; metal fluorides, such as $MgF_2$, LiF, Al $F_3$, $CaF_2$; polyethylene; polypropylene; polymethyl methacrylate; polyimide; polyurea; polytetrafluoro ethylene; polychlorotrifluoro ethylene; polydichlorodifluoro ethylene, a copolymer of chlorotrifluoro ethylene and dichlorodifluoro ethylene; a copolymer obtained by copolymerizing tetrafluoro ethylene and a monomer mixture containing at least one comonomer; a fluoride containing copolymer having a ring structure at the copolymer principal chain; a water absorbing substance having an absorption rate of 1% or grater; and an anti moisture substance having an absorption rate of 0.1% or less.

The method for forming the protective layers 50 is not particularly limited. The vacuum vapor deposition method, the sputtering method, the reactive sputtering method, the MBE (Molecular Beam Epitaxy) method, the cluster ion beam method, the ion plating method, the plasma polymerization method (the high frequency excitation ion plating method), the plasma CVD method, the laser CVD method, the heat CVD method, the gas source CVD method, the coating method, the printing method, or the transfer method are examples of methods that may be employed.

It is preferable for the refractive index of the first scattering portions 41 and the refractive index of the protective layers 50 of the organic EL elements 1 through 3 to be approximately the same, such that the light which is output through the light scattering layers 40 can be highly efficiently output.

The organic EL elements 1 through 3 are of a construction in which the protective layers 50 are provided on the light scattering layers 40. Alternatively, the light scattering layers 40 themselves may function as protective layers. IN addition, the protective layers 50 may be provided to cover the entire structure of the element from the substrate 10 to the light scattering layer 40, instead of being provided only on the surface of the light scattering layer 40.

<Seal>

The entirety of the organic EL elements 1 through 3 may be sealed by employing a sealing container or a sealing agent, to prevent matter that deteriorates the elements, such as moisture and oxygen, from entering the interiors of the elements.

In the case that the sealing container is employed, a water absorbing agent or an inert liquid may be sealed within the space between the light emitting element and the sealing container. The water absorbing agent is not particularly limited, and examples include:barium oxide; sodium oxide; potassium oxide; calcium oxide; sodium sulfate; calcium sulfate; magnesium sulfate; phosphorus pentaoxide; calcium chloride; magnesium chloride; copper chloride; cesium fluoride; niobium fluoride; calcium bromide; vanadium bromide; a molecular sieve; zeolite; and magnesium oxide. The inert liquid is not particularly limited, and examples include: paraffins; fluid paraffins; fluoride solvents such as perfluoro alkane, perfluoro amine, and perfluoro ether; chloride solvents; and silicone oil.

In the case that the sealing agent is employed to form a sealing layer, the sealing agent may be formed as a film by the coating method, the vapor deposition method, the sputtering method, or the like, to seal the element. The sealing agent is not particularly limited, but resin sealing agents may be favorably employed, because they are low cost and superior in workability.

Examples of resin sealing agents include: acrylic resins; epoxy resins; fluoride resins; silicon resins; rubber resins; ester resins; and the like. Among these, epoxy resins are preferable from the viewpoint of anti moisture functionality. Among epoxy resins, thermal curing epoxy resins and light curing epoxy resins are preferable.

It is preferable for the thickness of the sealing layer to be within a range from 1 μm to 1 mm. It is more preferable for the thickness of the sealing layer to be within a range from 5 μm to 100 μm. It is most preferable for the thickness of the sealing layer to be within a range from 10 μm to 50 μm. If the sealing layer is thinner than these ranges, it is difficult to obtain sufficient sealing effects. If the thickness of the sealing layer exceeds the upper limit of these ranges, the organic EL element itself becomes thick, which his not favorable from the viewpoints of miniaturization and forming thin elements.

Fillers which are superior in anti moisture properties and desiccant agents may be added to the sealing layer. Inorganic materials such as $SiO_2$, SiO (silicon oxide), SiON (silicon oxynitride), and SIN (silicon nitride) are preferred examples of the fillers to be added. The viscosity of the sealing agent increases, the workability thereof is improved, and the anti moisture properties thereof are improved by adding the fillers. Barium oxide, calcium oxide, and strontium oxide are preferred examples of the desiccant agent.

A resin sealing layer may be provided by pressure bonding or thermal pressure bonding a resin sheet.

Note that the sealing layer may be configured to be provided on at least a display region of a display element such as an organic EL panel, which is equipped with the organic EL elements and thin film transistors for driving the organic EL elements, provided on the same substrate.

The organic EL elements 1 through 3 emit light by applying direct current (the current may include alternate current components as necessary) voltage (generally within a range from 2 volts to 15 volts) between the anodes 21 and the cathodes 22.

Regarding the driving method of organic EL elements, the driving methods described in Japanese Unexamined Patent Publication Nos. 2(1990)-148687, 6(1994)-301355, 5(1993)-029080, 7(1995)-134558, 8(1996)-234685, and 8(1996)-241047,Japanese Patent No. 2784615, U.S. Pat. Nos. 5,828, 429, and 6,023,308 may be applied.

[Design Modifications]

The embodiments described above are organic EL elements of the top emission type. However, the light scattering layer 40 outputs evanescent light of light which is trapped within the interior of elements due to total internal reflection as scattered light. Therefore, similar advantageous effects can be obtained in the case that the light scattering layer 40 is provided at a totally internally reflecting surface toward the side at which light is output in an element of the bottom emission type. Similarly, the light scattering layers 40 may be provided at provided at totally internally reflecting surfaces toward the sides at which light is output in an element of the double sided emission type. In this case as well, the aforementioned advantageous effects can be obtained at each of the light outputting surfaces.

The embodiments described above are organic EL elements having organic compound layers as the light emitting layers 30. However, the light emitting element of the resent invention may be applied to inorganic EL elements having inorganic compound layers as the light emitting layers 30. Inorganic compound layers which are employed in known inorganic EL elements may be employed as the light emitting layer 30. An example of such an inorganic compound layer is a dielectric layer in which fluorescent substances are dispersed, such as ZnS.

Although the light emitting layers 30 differ between organic EL elements and inorganic EL elements, the mechanism of light emission is the same. Therefore, the configurations of the elements illustrated in FIG. 1 through FIG. 3 may be applied to inorganic EL elements, and similar advantageous effects can be obtained.

FIELD OF INDUSTRIAL APPLICABILITY

The light emitting element of the present invention can be favorably utilized to display elements, displays, backlights, electronic photographs, illuminating light sources, recording light sources, exposure light sources, readout light sources, labels, signs, interior lighting, optical communications, and the like.

The invention claimed is:

1. A light emitting element, comprising:
a substrate;
a pair of electrodes formed on a surface of the substrate;
a light emitting layer sandwiched between the pair of electrodes;
at least one of the pair of electrodes being a light transmitting electrode that is in contact with the light emitting layer, light being emitted from the light emitting layer by voltage being applied between the pair of electrodes, and the light being output from an upper surface of the light transmitting electrode; and
a light scattering layer provided on the upper surface of the light transmitting electrode, for scattering evanescent light which is output at the upper surface of the light transmitting electrode, and a protective layer provided on an upper surface of the light scattering layer not toward the side of the light transmitting electrode;
the light scattering layer having a first scattering portion and second scattering portions, wherein the first scattering portion has an uneven structure and a refractive index lower than the refractive index of the light transmitting electrode, wherein the uneven structure has a plurality of recessed portions, and each of the recessed portions have a bottom, and each of the recessed portions are open toward an upper surface of the light scattering layer, wherein said second scattering portions fill at least the bottoms of each of the recessed portions of the uneven structure of the first scattering portion and have a refractive index different from the refractive index of the first scattering portion, and wherein the refractive index of the first scattering portion and the refractive index of the protective layer are substantially the same; and
the distance between the bottoms of each of the recessed portions of the uneven structure and the upper surface of the light transmitting electrode is less than or equal to a penetration depth of the evanescent light.

2. A light emitting element as defined in claim 1, wherein: the second scattering portions are formed by metal.

3. A light emitting element as defined in claim 1, wherein: the second scattering portions are formed by a dielectric having a higher refractive index than the refractive index of the first scattering portion.

4. A light emitting element as defined in claim 1, further comprising:
a semi transmissive/semi reflective metal film provided between the light transmitting electrode and the light scattering layer.

5. A light emitting element as defined in claim 1, wherein: the light emitting layer is an organic electroluminescent element that includes an organic compound layer.

6. A light emitting element as defined in claim 1, wherein: the light emitting layer is an inorganic electroluminescent element that includes an inorganic compound layer.

7. A light emitting element as defined in claim 1, wherein the light transmitting electrode transmits 70% or greater of the light emitted by the light emitting layer.

8. A light emitting element as defined in claim 1, wherein the second scattering portions comprise a plurality of metal pieces which are provided discretely from each other in individual recessed portions.

* * * * *